United States Patent
Hanyu et al.

[11] Patent Number: 5,876,877
[45] Date of Patent: Mar. 2, 1999

[54] PATTERNED MASK HAVING A TRANSPARENT ETCHING STOPPER LAYER

[75] Inventors: Isamu Hanyu; Mitsuji Nunokawa; Satoru Asai, all of Kawasaki, Japan

[73] Assignee: Fujitsu Limited, Kawasaki, Japan

[21] Appl. No.: 813,387

[22] Filed: Dec. 27, 1991

[30] Foreign Application Priority Data

Dec. 28, 1990 [JP] Japan ................................. 2-415623

[51] Int. Cl.⁶ ............................................. G03F 9/00
[52] U.S. Cl. ............................................. 430/5; 430/330
[58] Field of Search ............................. 430/5, 4, 311, 430/330, 322

[56] References Cited

U.S. PATENT DOCUMENTS

| | | | |
|---|---|---|---|
| 4,401,367 | 8/1983 | Grantham et al. | 430/4 |
| 4,767,724 | 8/1988 | Kim et al. | 437/194 |
| 5,045,417 | 9/1991 | Okamoto | 430/5 |
| 5,114,813 | 5/1992 | Snoot et al. | 430/5 |

FOREIGN PATENT DOCUMENTS

| | | |
|---|---|---|
| 0 383 534 | 8/1990 | European Pat. Off. . |
| 0395425 | 10/1990 | European Pat. Off. . |
| 0451307 | 10/1991 | European Pat. Off. . |
| 61-278179 | 12/1986 | Japan . |
| 2-82661 | 3/1990 | Japan . |

*Primary Examiner*—S. Rosasco
*Attorney, Agent, or Firm*—Staas & Halsey

[57] ABSTRACT

An optical exposure mask for patterning an optical beam comprises an etching stop layer of a material that is substantially transparent with respect to the optical beam, a transparent pattern provided on one of upper and lower major surfaces of the etching stop layer, and an opaque pattern provided on one of the upper and lower major surfaces of the etching stop layer for patterning the optical beam, wherein the material for the etching stop layer is selected from a group essentially consisted of $Al_2O_3$, MgO and a mixture thereof, and the etching stop layer has an etching rate that is substantially smaller than the etching rate of a material forming the transparent pattern for any of dry and wet etching processes.

15 Claims, 9 Drawing Sheets

PATTERNED MASK HAVING A TRANSPARENT ETCHING STOPPER LAYER

BACKGROUND OF THE INVENTION

The present invention generally relates to semiconductor devices and more particularly to a mask having a patterned layer and a transparent layer that acts as an etching stop layer.

The photolithographic patterning is a fundamental process for fabricating semiconductor devices. In the photolithographic patterning process, a mask that carries thereon transparent and opaque device patterns is used for exposing a device pattern on a substrate. Conventionally, the resolution that can be achieved by the photolithographic patterning process has been limited to about 0.7 μm in correspondence to the wavelength of the optical beam that is used for the exposure.

In the recent very large scale integrated circuits (VLSIs) having a much higher integration density, on the other hand, the technique of submicron patterning is essential for achieving the desired submicron resolution. Such a high integration density contributes to the increased operational speed of the logic devices. In the memory devices, the increased integration density leads to the increased memory capacity. For example, the current 4M-bit DRAMs require the design rule of 0.8 μm. On the other hand, the so-called 16M-bit DRAMs require the design rule of 0.5–0.6 μm. Further, the future 64M-bit DRAMs require the design rule of 0.3 μm.

Currently, intensive efforts have been made to achieve the foregoing submicron patterning while using the conventional photolithographic patterning process. For example, the use of optical systems that have a larger numerical aperture is studied. By using the optical system having such an increased numerical aperture, one can increase the degree of resolution while using the conventional visible or ultraviolet optical beam. The use of the optical beam is particularly advantageous in view point of increasing the throughput of the exposure process. On the other hand, the use of optical systems having the increased numerical aperture raises a problem of decreased focal depth and various studies are made to eliminate the problem.

The use of so-called phase shift mask provides a preferable solution to the foregoing problems. In the phase shift mask, a transparent, phase shift pattern having a thickness determined by the wavelength of the optical beam, is provided to cancel the diffraction caused by the edge of the opaque device pattern formed on the mask. Generally, such a phase shift pattern is provided along the edge of the opaque pattern. When fabricating such a phase shift mask, it is necessary to pattern the transparent layer that forms the phase shift pattern while leaving the device pattern intact.

Conventionally, a silicon nitride film has been used as the etching stop layer that prevents further progress of the etching for protecting the device pattern. More specifically, the silicon nitride film is provided to bury the opaque device pattern underneath with a substantially flat upper major surface, and the transparent layer, typically of silicon oxide is provided on the upper major surface of the silicon nitride layer as the layer that forms the phase shift pattern. The phase shift pattern is thereby formed by etching the transparent layer, wherein the etching stops when the upper major surface of the silicon nitride is exposed as a result of the etching.

In the conventional phase shift mask thus fabricated, there exists a problem in that the silicon nitride layer absorbs the optical beam that is used for the exposure.

FIG. 1 shows the transmittance of a silicon nitride layer deposited on a silicon oxide substrate. In the currently used optical exposure system, the radiation with the wavelength of 436 nm in correspondence to the g-line of mercury is generally employed. In this wavelength, the silicon nitride layer can provide the transmittance of more than 60%. On the other hand, in the future optical exposure systems, the radiation having shorter wavelengths is going to be used. For example, the use of the radiation having the wavelength of 365 nm corresponding to the radiation of the i-line of mercury is studied. Further, the use of the radiation having the wavelength of 248 nm from the KrF excimer laser is studied. As can be seen in FIG. 1, the transmittance of the silicon nitride layer for these shorter wavelengths is less than 30%. This clearly indicates that the phase shift mask that has the silicon nitride etching stop layer cannot be used in the future optical exposure systems.

SUMMARY OF THE INVENTION

Accordingly, it is a general object of the present invention to provide a novel and useful optical mask and a fabrication process thereof, wherein the foregoing problems are eliminated.

Another and more specific object of the present invention is to provide an optical exposure mask that has a transparent pattern and a fabrication process thereof, wherein the optical absorption caused by the mask is minimized for optical beams having short wave lengths.

Another object of the present invention is to provide a process for selectively etching a silicon oxide with respect to an etching stop layer that is transparent to optical beams having a wavelength shorter than about 400 nm.

Another object of the present invention is to provide a process for fabricating a phase shift mask that carries a transparent phase shift pattern on an etching stop layer that buries thereunder a device pattern to be exposed on a substrate, wherein the etching stop layer contains one or both of aluminum oxide and magnesium oxide. According to the present invention, one can secure a sufficient transmittance in the etching stop layer for the optical radiation having the wavelength of about 400 nm or less, while simultaneously guaranteeing a distinct difference in the etching rate between the phase shift pattern and the etching stop layer. Thereby, the phase shift pattern can be formed without damaging the underlying device pattern.

Other objects and further features of the present invention will become apparent from the following detailed description when read in conjunction with the attached drawings.

DETAILED DESCRIPTION OF THE PREFERRED EMBODIMENTS

FIGS. 2(A)–2(E) show the process for fabricating the phase shift mask according to a first embodiment of the present invention.

Figure 1:
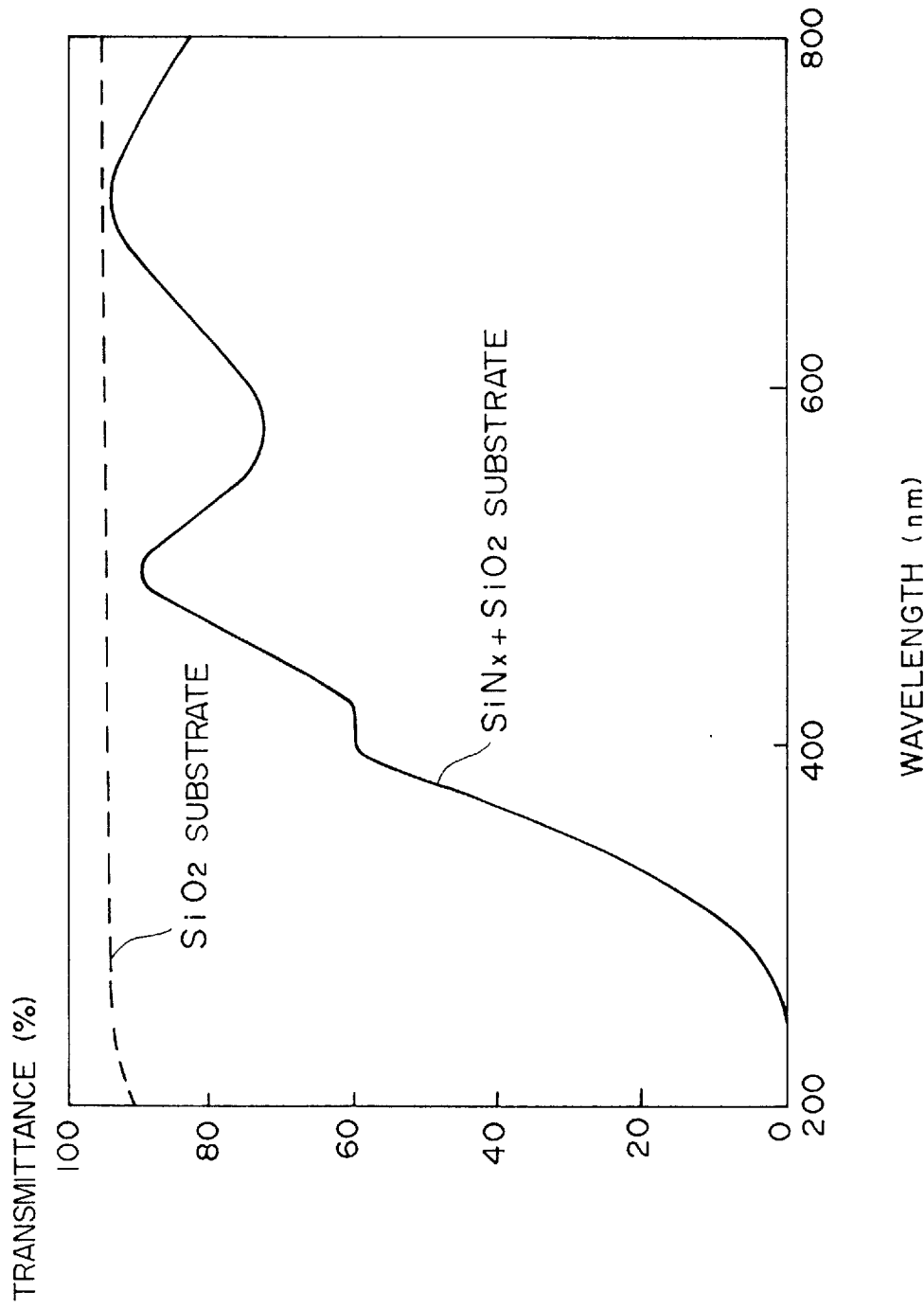
FIG. 1 is a graph showing the optical transmittance of a conventional phase shift mask that uses a silicon nitride etching stop layer.
Figure 2A:
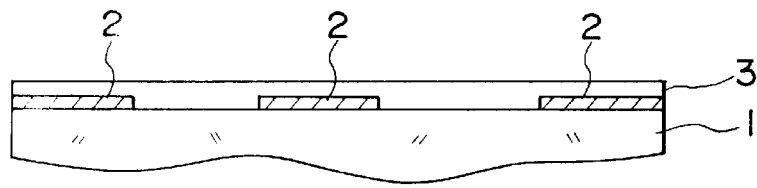
FIGS. 2(A)–2(E) are diagrams showing the process for fabricating a phase shift mask according to a first embodiment of the present invention.

Referring to FIG. 2(A) first, a device pattern 2 of chromium is formed on the upper major surface of a transparent substrate 1 of silicon oxide. Further, an etching stop layer 3 to be described later in detail is deposited on the device pattern 2 to bury the same underneath. The layer 3 thereby has a substantially flat upper major surface.

Figure 2B:
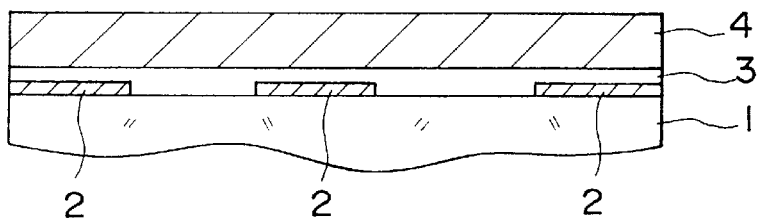
Figure 2C:
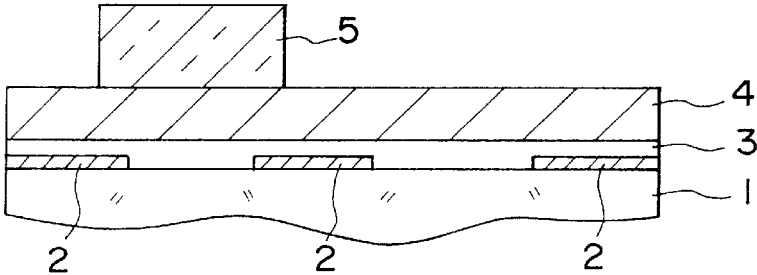

In the step of FIG. 2(B), a phase shift layer 4 typically of silicon oxide is deposited on the upper major surface of the etching stop layer 3, and a photoresist layer (not shown) is applied on the upper major surface of the phase shift layer 4 thus formed. The photoresist layer is then patterned to form a photoresist pattern 5 as shown in FIG. 2(C).

Figure 2D:
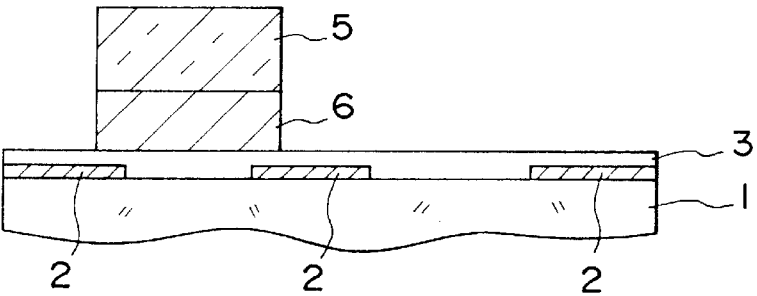
Figure 2E:
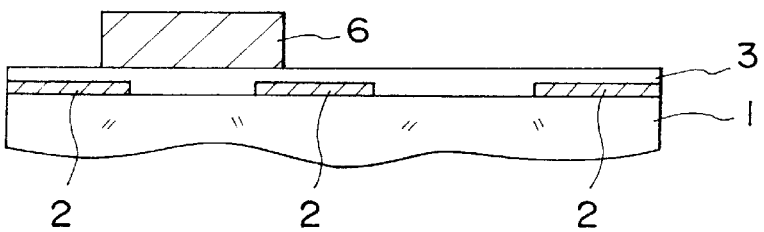

Next, in the step of FIG. 2(D), the phase shift layer 4 is patterned while using the photoresist pattern 5 as an etching mask. After removing the photoresist pattern 5, a mask having a cross section shown in FIG. 2(E) is obtained wherein a phase shift pattern 6 is formed.

In the foregoing process, the thickness t of the phase shift layer 3 is set to satisfy the following relationship $$t = \lambda/(2n-1)$$

wherein n represents the refractive index of the layer 3 and $\lambda$ represents the wavelength of the optical radiation that is used for the exposure. Thereby, the phase of the optical beam that has passed through the phase shift pattern 6 is inverted by 180°. Typically, the layer 4 is formed by depositing silicon oxide by a vacuum evaporation deposition or sputtering process.

The etching stop layer 3 is an essential part of the present invention and is preferably formed with a thickness t' that satisfies a relationship $$t' = \lambda/2n'$$

wherein n' represents the refractive index of the layer 3. When aluminum oxide having the refractive index of 1.68 is used for the layer 3 in combination with the optical radiation from the g-line of mercury, the thickness t' should be set to about 1300 Å. Preferably, the etching stop layer 3 is deposited by an electron beam source evaporation process while simultaneously irradiating an oxygen ion beam. The etching stop layer 3 thus formed should have the excellent transparency with respect to the optical beam having the wavelength of 400 nm or less. The transparency with respect to the radiation from the KrF excimer lasers (248 nm) or the mercury i-line (365 nm) is particularly important in view of the optical exposure system used in future. Of course, the etching stop layer 3 should have an excellent resistance against the etching that is used at the time of patterning the phase shift layer 4.

In the present invention, the inventors have found that the material on the join (i.e., phase equilibria) $Al_2O_3$-MgO satisfies the foregoing requirements. Hereinafter, the result of experiments conducted on the material will be described in detail.

In the experiment, a layer of the material on the foregoing join of $Al_2O_3$-MgO (i.e., pure $Al_2O_3$ and pure MgO) was deposited on a silicon oxide substrate with various compositions including the end member compositions $Al_2O_3$ and MgO. Hereinafter, the layer thus formed will be referred to as the etching stop layer in relation to the foregoing structure of FIGS. 2(A)–2(E). As already noted, the deposition was made by the electron beam source evaporation process with the substrate temperature of 300° C. while irradiating the oxygen ion beam with the acceleration voltage of 0.6 kV and the current of 100 mA. The pressure in the deposition chamber was set to 5–7 × $10^{-5}$ Torr.

About the test specimen thus obtained, the etching rate was measured for the wet etching process and the dry etching process. In this test, the specimens as-formed as well as the specimens that have been annealed at 700° C. and 900° C. were used. The annealing was achieved by heating the specimen by the infrared lamp for about 30 minutes. It should be noted that each specimen has a structure wherein the etching stop layer is deposited on the silicon oxide substrate with the thickness of about 150 nm.

The following TABLE I summarizes the result of the wet etching test conducted for various compositions of the etching stop layer. The etching was conducted in a buffered solution of HF that contains 50% HF and 40% $NH_4F$ with the ratio of 1:10.

TABLE I

| ATOMIC RATIO OF Mg AND Al | | ETCH RATE (Å/MIN) | |
|---|---|---|---|
| | | 700° C. | 900° C. |
| Mg | Al | no anneal | 30 min | 30 min |
| 1 | 0 | 100 | 600 | | 20 |
| 2 | 15.9 | 84.1 | >1500 | 1300 | ≈3 |
| 3 | 28.4 | 71.6 | >1500 | 1480 | ≈0 |
| 4 | 31.0 | 69.0 | >1500 | >1500 | 12 |
| 5 | 44.1 | 55.9 | 50 | 13.0 | 28 |
| 6 | 46.5 | 53.5 | 54 | 9.4 | 11 |
| 7 | 100 | 0 | >1500 | | 380 |

As silicon oxide has the etching rate of 1300 Å/min under the same etching condition, the compositions 1, 2, 3, 4 and 7 in the as-deposited state are not suitable for the etching stop layer as long as the wet etching process is used. It should be noted that the conventional silicon nitride etching stop layer has the etching rate of 20 Å/min. Only the compositions 5 and 6 have the etching rate fairly comparable with the etching rate of conventional silicon nitride. On the other hand, much improved etching rate is obtained when the etching stop layer is annealed at 900° C. for the compositions 1–6. Although the cause of this difference is not explored yet, it is possible that a change in the mineral composition occurs in the etching stop layer including the formation of spinel ($MgAlO_4$) from the as-deposited material. Further, the improved quality of crystal caused by the heat treatment may contribute to the change of the etching rate for the end components 1 and 7. When the temperature of annealing is 700° C., on the other hand, no substantial change in the etching rate was observed for the compositions 1–7.

When the dry etching process is employed, on the other hand, it was confirmed that the etching rate is about 0–3 Å/min for the entire composition of the etching stop layer even in the as-deposited state. The etching was conducted by an etching gas of a mixture of $CHF_3$, $C_2F_6$ and He with the flow rate of 10, 15 and 80 SCCM respectively, at the pressure of 1300 mTorr while applying an electric power of 120 watts. It should be noted that silicon oxide shows the etching rate of 980 Å/min. Thus, the foregoing compositions 1–7 act as the effective etching stop when the dry etching process is used.

Figure 3:
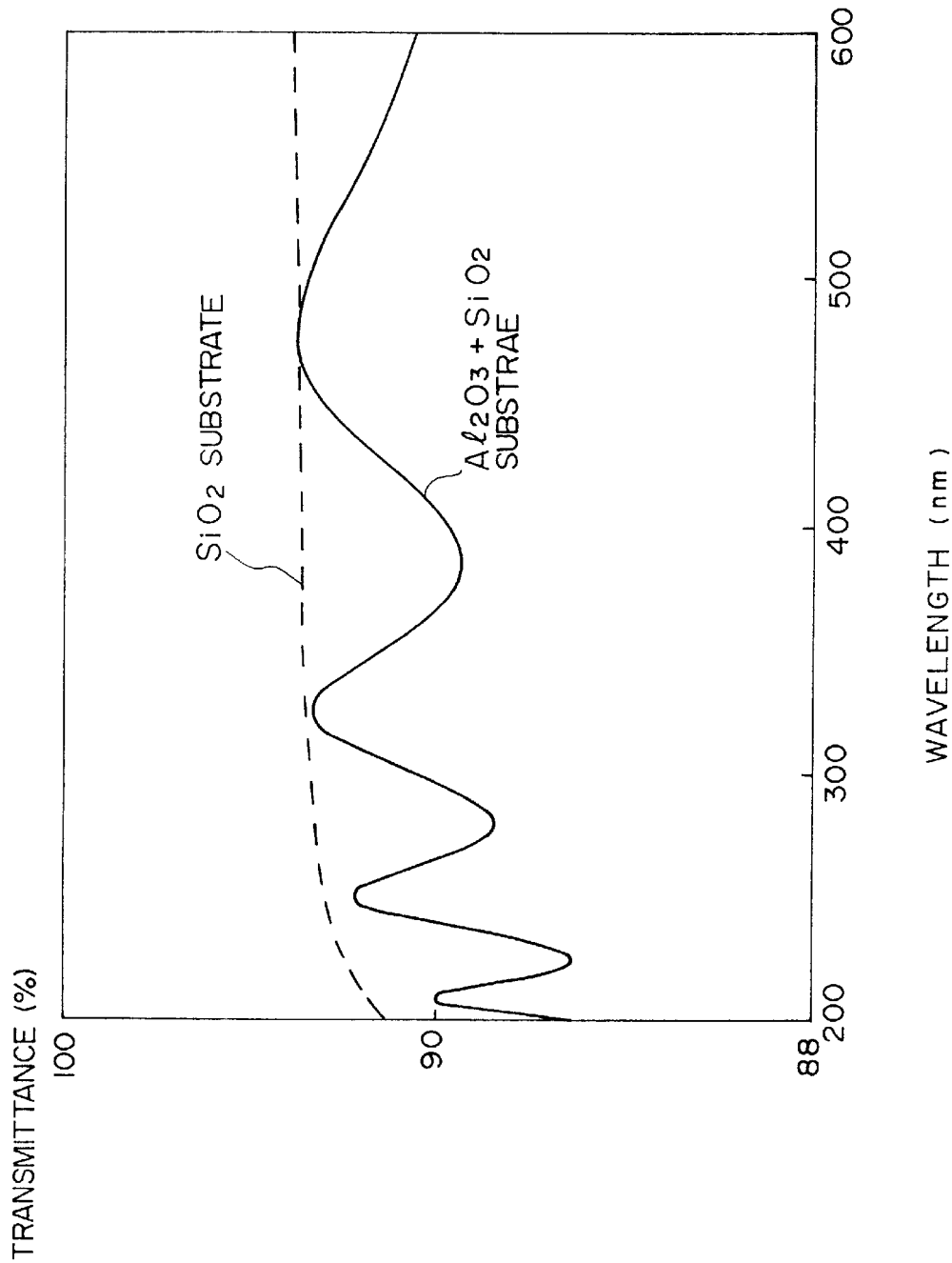
FIG. 3 is a graph showing the optical transmittance of the phase shift mask of the first embodiment wherein $Al_2O_3$ is used for the etching stop layer.

FIG. 3 shows the transmittance of the specimen 1 wherein aluminum oxide etching stop layer is deposited on the silicon oxide substrate. As can be seen in FIG. 3, the transmittance exceeds about 88% even when the wavelength of the optical radiation is less than 400 nm. In fact, there is little difference in the transmittance between the silicon oxide substrate itself and the specimen 1 wherein the aluminum oxide etching stop layer is formed on the silicon oxide substrate.

Figure 4:
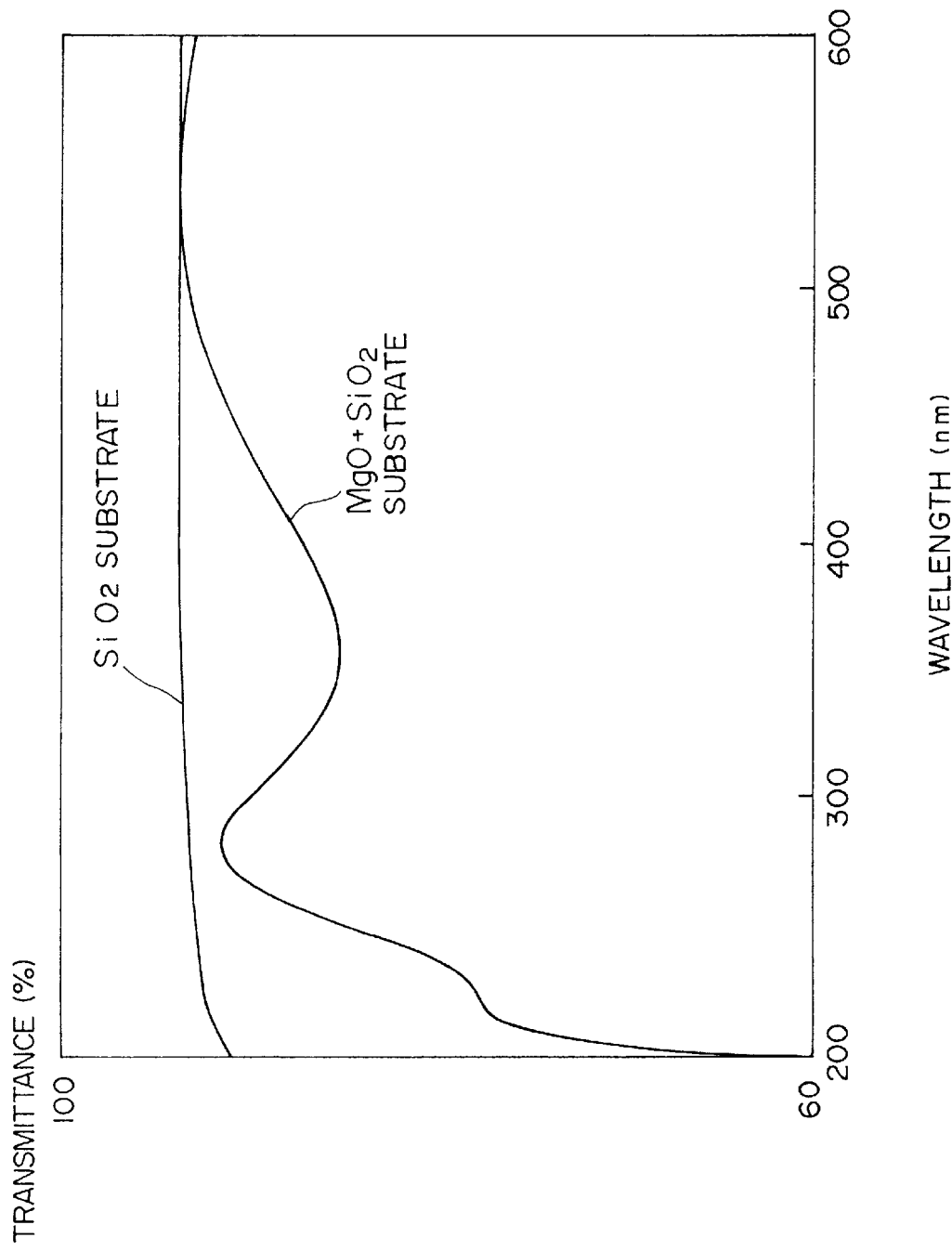
FIG. 4 is a graph showing the optical transmittance of the phase shift mask wherein MgO is used for the etching stop layer.

FIG. 4 shows the transmittance of the specimen 7 wherein magnesium oxide etching stop is deposited on the silicon oxide substrate. In this case, too, an optical transmittance exceeding about 80% is achieved for the optical radiation that has the wavelength of less than 400 nm. Particularly, a conspicuous peak of transmittance is observed at the wavelength slightly smaller than 300 nm.

Figure 5:
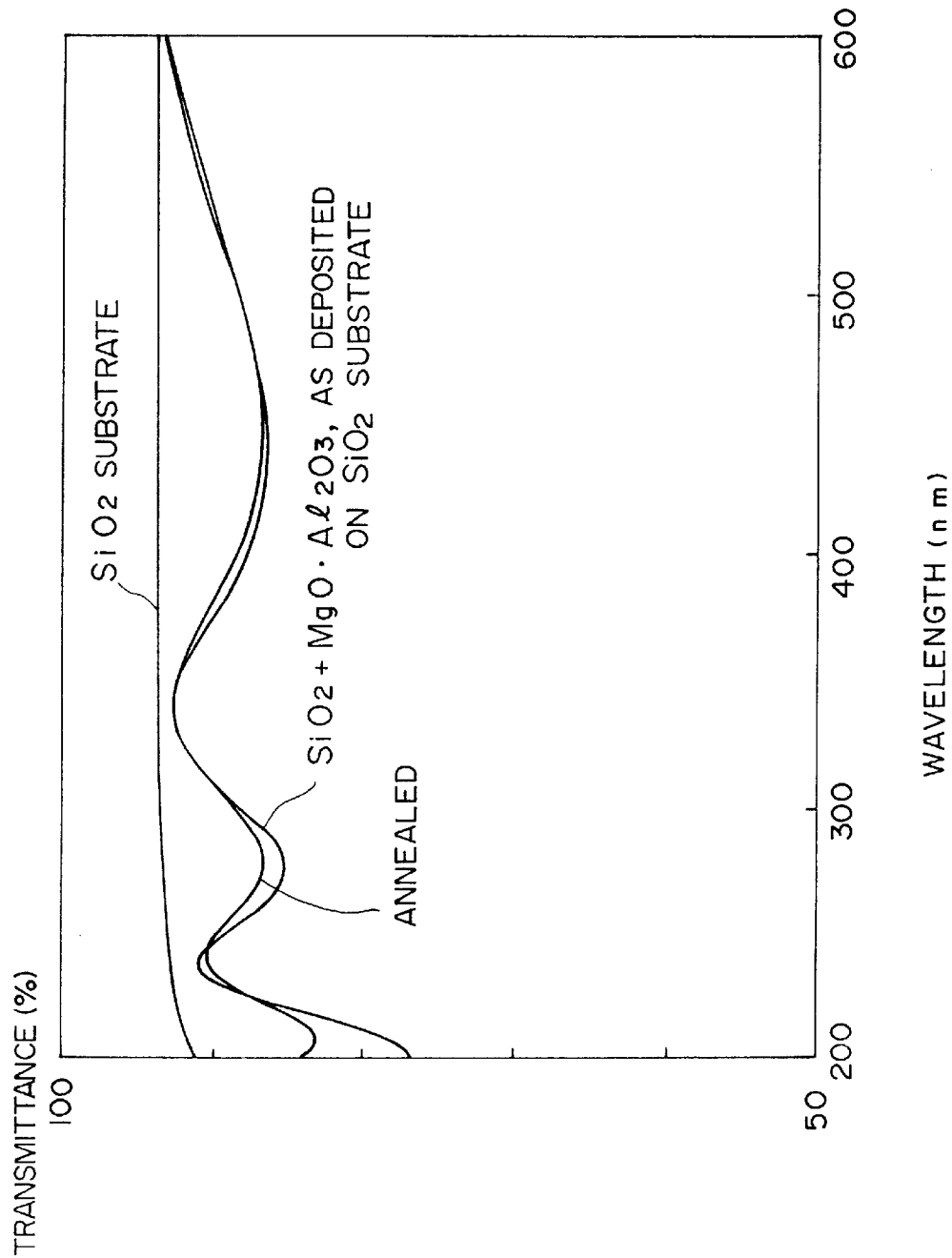
FIG. 5 is a graph showing the optical transmittance of the phase shift mask wherein a material on the MgO-$Al_2O_3$ join is used for the etching stop layer.

Further, FIG. 5 shows the transmittance of the specimen that has the etching stop layer in which Mg and Al are contained with the atomic ratio of 0.49:0.51 for both the as-deposited state and the annealed state. As can be seen, this specimen, too, shows the transmittance close to 90% even in the wavelength less than 400 $\mu$m.

From the foregoing FIGS. 3, 4 and 5, it was clearly demonstrated that the material on the join $Al_2O_3$-MgO has the excellent transparency for the optical radiation of the wavelength less than 400 nm and simultaneously has a sufficient resistance against etching, particularly when annealed at a temperature of about 900° C. Thus, when the material on the join $Al_2O_3$-MgO is used for the etching stop layer 3 of the phase shift mask described previously, one can reduce the absorption of the optical beam by the mask even in the future optical exposure systems that use the KrF excimer laser radiation or the i-line radiation of mercury lamp.

Figure 6:
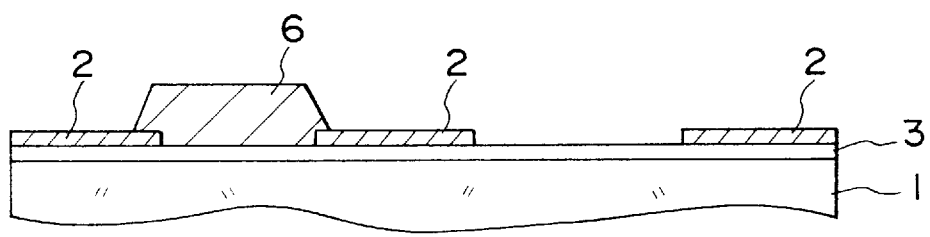
FIG. 6 is a diagram showing a phase shift mask according to a second embodiment of the present invention.

FIG. 6 shows a phase shift mask according to a second embodiment of the present invention.

Referring to FIG. 6, the phase shift mask of the present embodiment has the etching stop layer 3 provided directly on the upper major surface of the silicon oxide substrate 1, and the chromium device pattern 2 is formed on the upper major surface of the etching stop layer 3. Further, the phase shift pattern 6 is formed by patterning silicon oxide layer 4 (not shown in FIG. 6) selectively with respect to the etching stop layer 3. Similar to the previous embodiment, the etching stop layer 3 is formed of the material on the $Al_2O_3$-MgO join in the as-deposited state or after annealing.

In the structure of FIG. 6, one can repair the defective phase shift pattern easily.

Figure 7A:
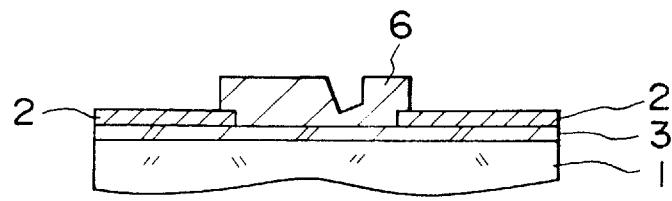
FIGS. 7(A)–7(E) are diagrams showing the process for repairing defects in the phase shift mask of FIG. 6.
Figure 7B:
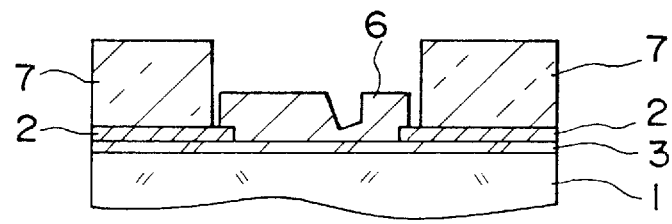
Figure 7C:
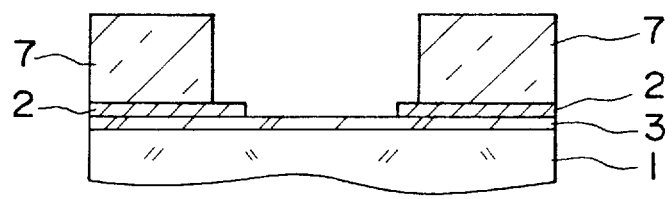

Referring to FIGS. 7(A)–7(E) showing the typical repairing process, any defective phase shift pattern 6 shown in FIG. 7(A) is removed by applying a coating of a photoresist 7 on the structure of FIG. 7(A) and patterning the photoresist to form the patterned resist 7 as shown in FIG. 7(B). By applying an etching process while using the patterned resist 7 as the mask, one can remove the defective phase shift pattern 6 entirely as shown in FIG. 7(C). As the etching stop layer 3 located under the phase shift pattern 6 is substantially immune to the etching, the layer 3 remains intact.

Figure 7D:
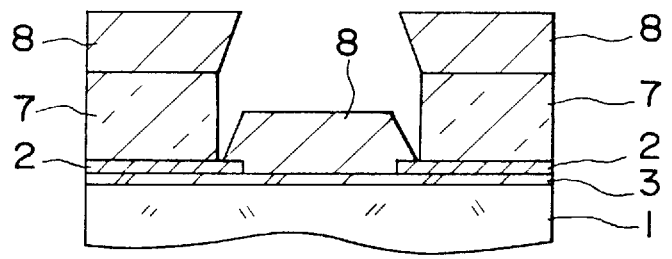
Figure 7E:
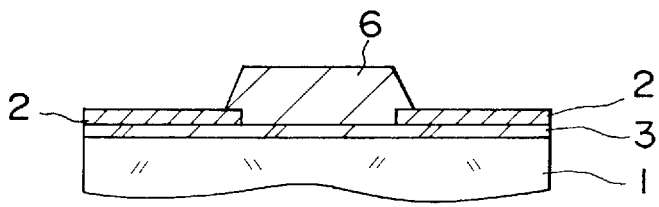

Next, in the step of FIG. 7(D), a layer 8 of silicon oxide is deposited with the thickness t that satisfies the thickness of the phase shift pattern described previously ($t=\lambda/2(n-1)$), the layer 8 on the photoresist 7 is removed by the lift off process as shown in FIG. 7(E). Thereby, a defect-free phase shift pattern 6 is formed in place of the defective phase shift pattern.

Figure 8:
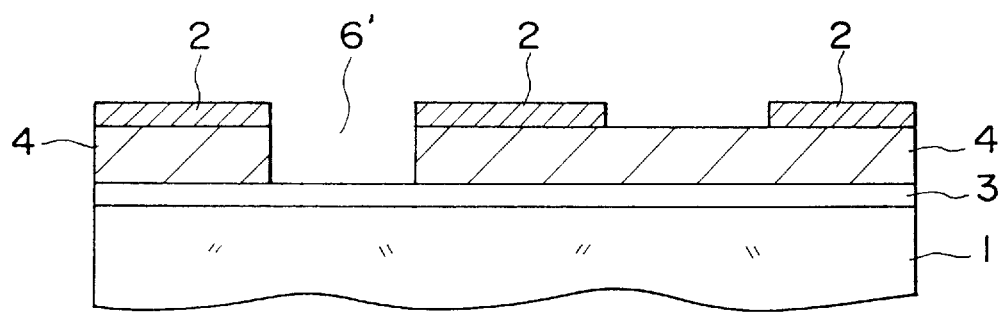
FIG. 8 is a diagram showing a phase shift mask according to a third embodiment of the present invention.

FIG. 8 shows the phase shift mask according to a third embodiment of the present invention.

In the present embodiment, the etching stop layer 3 is provided directly on the upper major surface of the silicon oxide substrate 1 similarly to the second embodiment, and the phase shift layer 4 of silicon oxide is provided on the upper major surface of the etching stop layer 3 directly. Further, the chromium device pattern 2 is provided on the phase shift layer 4. In correspondence to the gap between adjacent device patterns 2, the layer 4 is selectively etched to form a phase shift pattern 6' that acts exactly the same as the phase shift pattern 6 of the foregoing embodiments. In the present embodiment, the etching forming the pattern 6' stops exactly at the upper major surface of the etching stop layer 3. It should be noted that the etching stop layer 3 of the present embodiment employs also the material on the $Al_2O_3$-MgO join and thereby the excellent optical transparency for the etching stop layer 3 is guaranteed as well as the excellent selectivity of the etching process.

Figure 9A:
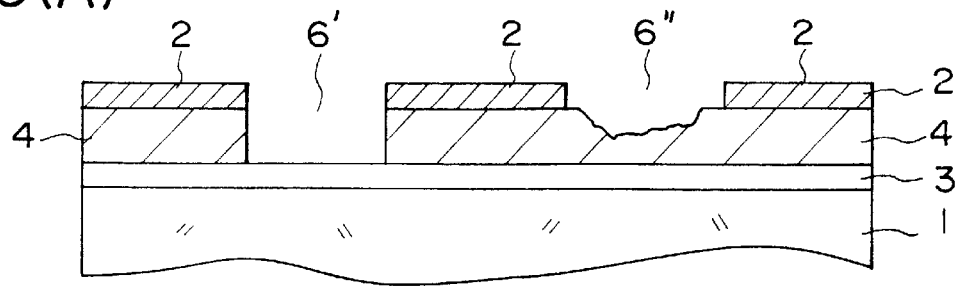
FIGS. 9(A)–9(C) are diagrams showing the process for repairing defects in the phase shift mask of FIG. 8.
Figure 9B:
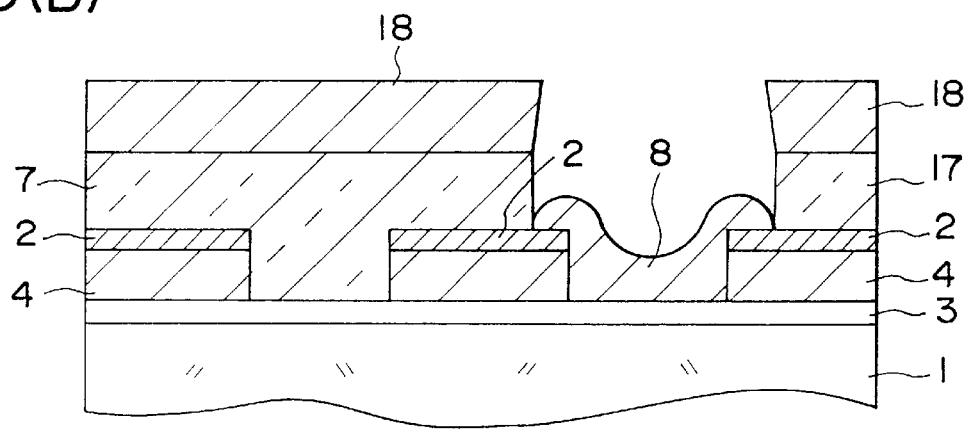
Figure 9C:
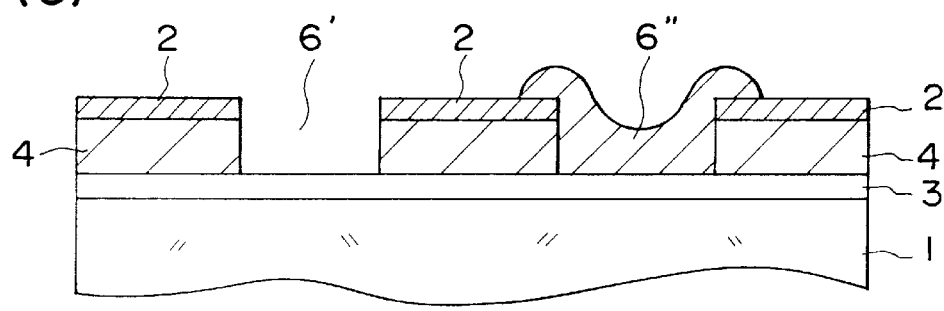

FIGS. 9(A)–9(C) show the process for repairing the defective phase shift pattern in the phase shift mask of the third embodiment.

Referring to FIG. 9(A) showing a defective phase shift mask that includes a defective region 6" on the phase shift layer 4, a photoresist 17 is applied on the structure of FIG. 7(A) and patterned to expose the defective region 6" as shown in FIG. 9(B). Because of the excellent selectivity in the etching rate, the etching stop layer 3 remains substantially intact after the defective phase shift pattern is removed by the etching. Further, a phase shift layer 18 of silicon oxide is deposited on the upper major surface of the photoresist 17 such that the silicon oxide fills the defective region 6" as shown in FIG. 9(B). After lifting off the silicon oxide layer 18 together with the photoresist 17, one obtains the structure shown in FIG. 9(C) wherein the defective region 6" is repaired.

The phase shift mask of any of the foregoing embodiments uses the etching stop layer 3 that covers the entire surface of the substrate 1. By using the material on the join $Al_2O_3$-MgO for the layer 3, one can substantially reduce the optical absorption particularly in the wavelength that is less than about 400 nm. Further, by applying a heat treatment to the mask thus formed, one can achieve a large selectivity in the etching rate with respect to the silicon oxide layer that is used for the phase shift mask.

Further, the present invention is not limited to the embodiments described heretofore, but various variations and modifications may be made without departing from the scope of the invention.

What is claimed is:

1. An optical exposure mask for patterning an optical beam, comprising:

an etching stop layer of a material containing MgO or a compound formed from MgO and $Al_2O_3$, said etching stop layer having upper and lower major surfaces and said material being substantially transparent to the optical beam used for the exposure;

a transparent pattern of a material provided on one of said upper and lower major surfaces of said etching stop layer, said transparent pattern passing the optical beam freely; and an opaque pattern provided on one of said upper and lower major surfaces of said etching stop layer for patterning the optical beam, said opaque pattern being defined be an edge, said etching stop layer having an etching rate substantially smaller than an etching rate of the material that forms the transparent pattern for any of dry and wet etching processes, and said transparent pattern being provided along said edge of said opaque pattern and having a thickness set to cancel a diffraction of the optical beam at said edge of said opaque pattern.

2. A mask as claimed in claim 1 in which said material forming the transparent pattern comprises silicon oxide and the material forming the etching stop layer has an etching rate that is substantially smaller than the etching rate of silicon oxide.

3. A mask as claimed in claim 1, wherein said material forming said etch stop layer is selected from a group consisting of MgO and a mixture of MgO and $Al_2O_3$.

4. An optical exposure mask as set forth in claim 1, wherein said material comprises a compound formed from MgO and $Al_2O_3$.

5. A method for forming a phase shift mask, comprising the steps of:

providing a first layer of a material containing MgO or a compound formed from MgO and $Al_2O_3$ on a transparent substrate, said material being substantially transparent to an optical beam used for exposure;

depositing a second layer of silicon oxide on said first layer; and patterning said second layer by an etching process to form a phase shift pattern while using the first layer as an etching stopper.

6. A method as claimed in claim 5 in which said step of providing the first layer comprises a step of depositing said material on said substrate by an electron beam source evaporation process while irradiating an oxygen ion beam.

7. A method as claimed in claim 6 in which said etching process for patterning the second layer is achieved by a dry etching process.

8. A method as claimed in claim 5 in which said step of providing the first layer comprises a step of depositing said material on the substrate, and a step of annealing said first layer at a temperature set such that the first layer is substantially immune to the etching.

9. A method as claimed in claim 8 in which said temperature is set to about 900° C.

10. A method as claimed in claim 8 in which said etching process for patterning the second layer is achieved by a wet etching process.

11. A method as claimed in claim 5 in which said method further comprises a step of removing the phase shift pattern selectively with respect to the first layer in correspondence to a defective part of the phase shift pattern, and depositing a second phase shift pattern in correspondence to said defective phase shift pattern.

12. A method as claimed in claim 5, wherein said material forming said first layer has a composition located on said join of $Al_2O_3$-MgO including MgO.

13. A method for forming a phase shift pattern on a substrate of silicon oxide, comprising the steps of:

depositing a first layer of a material containing MgO or a compound formed from MgO and $Al_2O_3$ on said substrate, said material being substantially transparent to an optical beam used for exposure;

depositing a second layer of a transparent material on said first layer; and patterning said second layer to form said phase shift pattern.

14. A method as claimed in claim 13 in which said method further comprises a step of annealing said first layer before the step of patterning at a temperature of about 900° C.

15. A method as claimed in claim 13, wherein said material forming said first layer has a composition located on said join of $Al_2O_3$-MgO including MgO.

* * * * *